(12) United States Patent
Hirae et al.

(10) Patent No.: US 6,729,561 B2
(45) Date of Patent: May 4, 2004

(54) CLEANING NOZZLE AND SUBSTRATE CLEANING APPARATUS

(75) Inventors: Sadao Hirae, Kyoto (JP); Masanobu Sato, Kyoto (JP); Shuichi Yasuda, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 142 days.

(21) Appl. No.: 09/976,134

(22) Filed: Oct. 11, 2001

(65) Prior Publication Data

US 2002/0020763 A1 Feb. 21, 2002

(51) Int. Cl.$^7$ ................................. B05B 7/04
(52) U.S. Cl. .............. 239/418; 239/423; 239/434.5; 239/590; 239/589; 239/594; 239/DIG. 8
(58) Field of Search ............. 239/589, 590, 239/591, 592, 594, DIG. 2, DIG. 8, DIG. 13, DIG. 19, 418, 423, 433, 434.5

(56) References Cited

U.S. PATENT DOCUMENTS

| | | | | |
|---|---|---|---|---|
| 3,823,408 A | * | 7/1974 | Gordon, III | 239/601 |
| 5,927,306 A | * | 7/1999 | Izumi et al. | 239/102.2 |
| 5,969,353 A | * | 10/1999 | Hsieh | 239/690 |
| 6,079,225 A | * | 6/2000 | Ruppert et al. | 65/17.2 |
| 6,485,689 B1 | * | 11/2002 | Huang et al. | 239/418 |

FOREIGN PATENT DOCUMENTS

| | | |
|---|---|---|
| JP | 08-294679 | 11/1996 |
| JP | 08-318181 | 12/1996 |
| JP | 10-156229 | 6/1998 |

OTHER PUBLICATIONS

W.T. McDermott et al., "Removing Submicron Surface Particles Using a Cryogenic Argon–Aerosol Technique," Microcontamination 9:33 (Oct. 1991).
S.A. Hoenig, "New Technology for the Detection and Control of Contamination in the One Micron Semiconductor Manufacturing Environment," SEMI Tech. Symp. Proc., Tokyo, p. G–1–1–G–1–8 (1985).
T. Ohmori et al., "Ice Scrubber Cleaning", *Ultra Clean Technology*, vol. 1, No. 1, pp. 35–42, 1990.

* cited by examiner

Primary Examiner—Robin O. Evans
(74) Attorney, Agent, or Firm—Ostrolenk, Faber, Gerb & Soffen, LLP

(57) ABSTRACT

A cleaning nozzle includes a mixing portion with inner walls thereof formed of quartz given smoothing treatment. As a result, the inner walls of the mixing portion have smooth surfaces. This construction effectively suppresses abrasion of the inner walls of the mixing portion, and particle generation from the cleaning nozzle. Further, the cleaning nozzle has a supply pipe surrounding a gas introduction pipe. This reduces areas of contact in the mixing portion between a gas and inner walls of the cleaning nozzle, to suppress particle generation with increased effect.

23 Claims, 5 Drawing Sheets

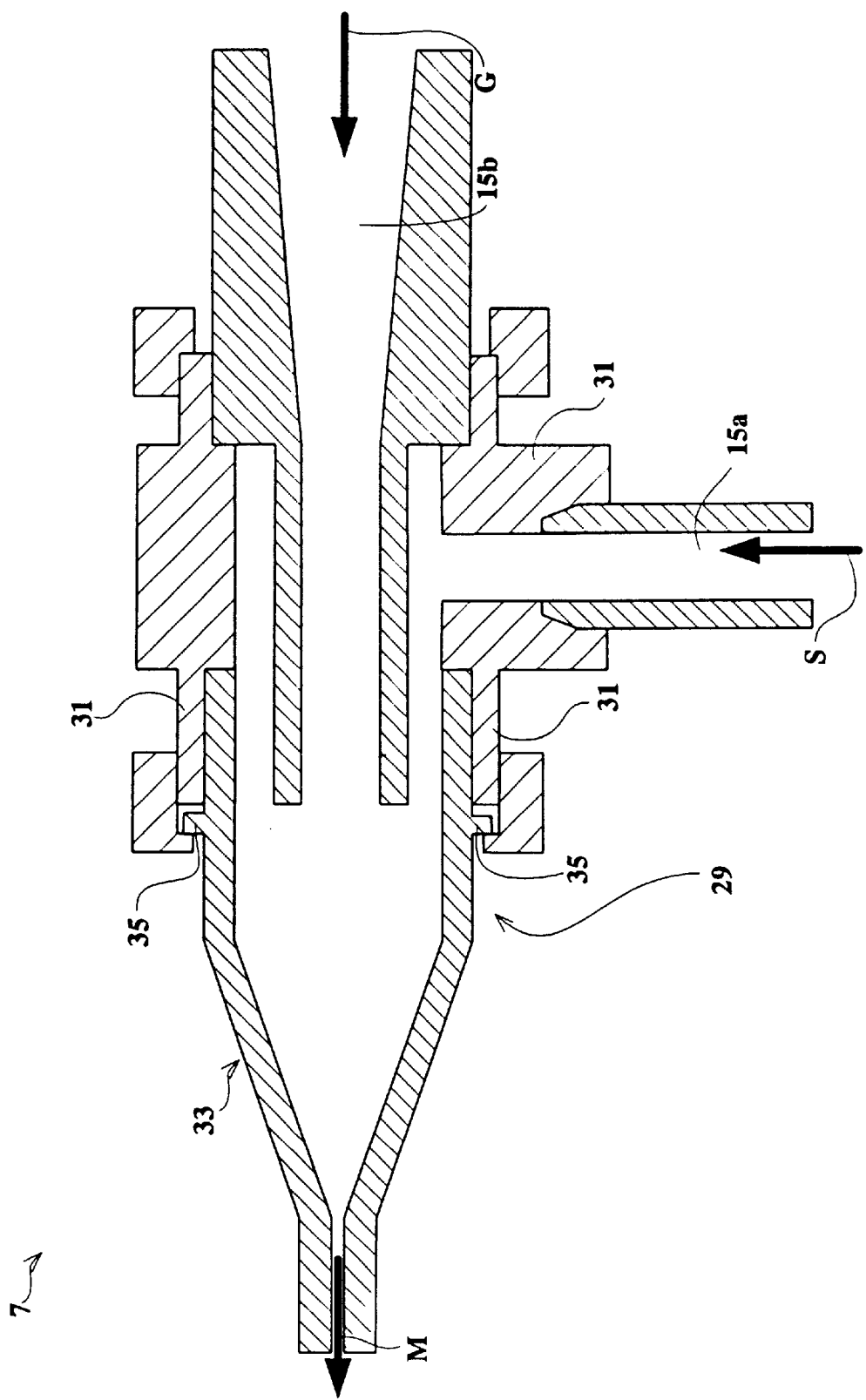

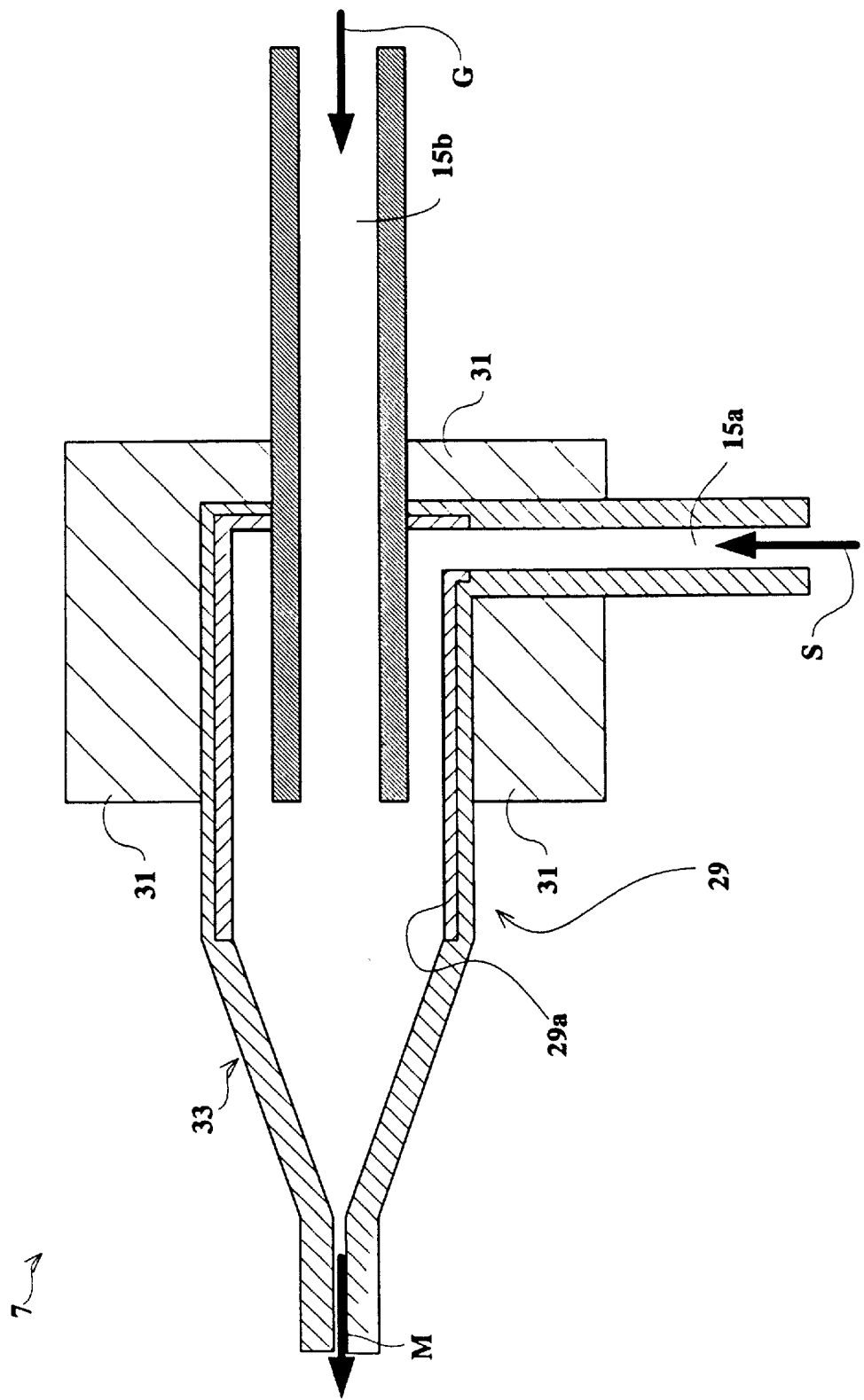

CLEANING NOZZLE AND SUBSTRATE CLEANING APPARATUS

BACKGROUND OF THE INVENTION (1) Field of the Invention

The present invention relates to cleaning nozzles and substrate cleaning apparatus for performing cleaning treatment of semiconductor substrates, glass substrates for liquid crystal displays, glass substrates for photomasks, substrates for optical disks and the like (hereinafter referred to simply as substrates) by supplying a cleaning solution to the substrates, and film removing treatment of such substrates by supplying a treating solution to the substrates to remove film coatings therefrom. More particularly, the invention relates to cleaning treatment and film removing treatment performed by supplying substrates with a cleaning solution converted to mist by mixing a pressurized gas therewith.

(2) Description of the Related Art

A conventional cleaning of substrates, i.e. scrub cleaning, includes physical cleaning for removing particles and the like from surfaces of substrates without using a chemical solution, and chemical cleaning for removing particles and the like from surfaces of substrates by using a chemical solution or gas.

Typical examples of physical cleaning include a "brush scrub method" in which a brush is placed in direct contact with a substrate surface spinning at high speed to scrub the substrate surface, and an "ultrasonic scrub method" in which super pure water with ultrasonic wave applied thereto is supplied to a substrate surface to apply ultrasonic vibration thereto. Typical examples of chemical cleaning include an "ice scrub method" which delivers minute ice particles toward a substrate (see T. Ohmori et al.: Ultra Clean Technology 1, 35 (1990)), a "dry ice scrub method" which provides cleaning with dry ice (see S. A. Hoening: SEMI Tech. Symp. Proc., Tokyo, p.G-I-I (1985)), a "solid argon scrub method" which provides cleaning with argon gas (see W. McDormotto et al.: Microcontamination 9, 33 (1991)), and a "mist jet scrub method" for delivering a cleaning solution converted to mist by mixing a pressurized gas therewith, from a pressure type binary fluid cleaning nozzle toward a substrate. Further, a "compound method" is known which combines a physical cleaning method and a chemical cleaning method.

In manufacturing integrated circuits (LSI or large scale integrated circuits) on semiconductor substrates, for example, increasingly minute patterns are fabricated into the substrates with progress in the degree of semiconductor integration. The above physical cleaning methods have the drawback of serious physical damage done to such patterns.

Conversely, the chemical cleaning methods, particularly the "mist jet scrub method", is capable of increasing the rate of delivery of the cleaning liquid in mist near the velocity of sound. Sufficient cleaning effect is achieved by using only super pure water as cleaning liquid, without using acid or alkali as cleaning liquid. Of course, acid or alkali may be used as cleaning liquid. Since no direct contact is made with substrates, patterns are free from physical damage.

However, the conventional "mist jet scrub method" noted above also has the following drawback.

Though, as a main task, particles adhering to a substrate surface before cleaning are removed, particles newly generated in the course of cleaning are not removed but remain adhering to the substrate surface after the cleaning. A large part of the particles newly generated is particles from the cleaning nozzle. However, little or no consideration has been made as to a method of suppressing such particles generated from the cleaning nozzle.

SUMMARY OF THE INVENTION

This invention has been made having regard to the state of the art noted above, and its object is to provide a cleaning nozzle and a substrate cleaning apparatus capable of suppressing particles generated from the cleaning nozzle.

To fulfill the above object, the following findings have been made.

As noted above, little or no consideration has been made as to a method of suppressing particles generated from the cleaning nozzle.

Inventors carried out experiment with regard to various locations in the cleaning nozzle, on the assumption that particle generation from the cleaning nozzle was caused by abrasion of inner wall surfaces of the cleaning nozzle.

Referring to FIG. 1, inner wall surfaces f of a cleaning nozzle 1 are rough surfaces. As a result, the inner wall surfaces f are found to undergo abrasion by a gas G since the gas G in the cleaning nozzle 1 has been pressurized and compressed. The cleaning nozzle 1 has a mixing portion 3 where the gas G is mixed with a cleaning liquid S to form mist M. In the mixing portion 3 in particular, abrasion of the inner walls of the cleaning nozzle is found most conspicuous. This is due to surface irregularities caused by flaws or the like made in time of manufacturing the cleaning nozzle. Such irregularities are abraded to generate dust particles.

Then, Inventors considered that a large part of the particles generated from the cleaning nozzle resulted from abrasion of the inner wall surfaces of the mixing portion of the cleaning nozzle. A cleaning nozzle has been invented, which has inner wall surfaces of the mixing portion of the cleaning nozzle less susceptible to abrasion, thereby to suppress particle generation from the cleaning nozzle.

The present invention made on the above findings provides the following construction.

A cleaning nozzle according to the present invention has a mixing portion for mixing a cleaning liquid and a pressurized gas to form mist, and discharges the mist formed in the mixing portion, wherein the cleaning nozzle has inner walls of at least the mixing portion presenting smooth surfaces.

The cleaning nozzle according to the invention has at least inner walls of the mixing portion presenting smooth surfaces. This construction is effective to suppress abrasion of the inner wall surfaces of the mixing portion of the cleaning nozzle, thereby suppressing particle generation from the cleaning nozzle.

A preferred example of the material for forming the inner wall surfaces of the mixing portion is quartz. Quartz is a hard material which is effective for preventing abrasion of the inner wall surfaces of the cleaning nozzle in order to suppress particle generation from the cleaning nozzle. Of course, other materials may be used, such as ceramics and sapphire, as long as the inner wall surfaces of the mixing portion are formed smooth.

It is sufficient to have at least the inner wall surfaces of the mixing portion formed smooth. Thus, the entire inner walls of the cleaning nozzle, or the main body of the cleaning nozzle, may be formed of a material, such as quartz, that presents smooth surfaces.

Preferably, the inner walls have a degree of smoothness with surface irregularities in a range of 0.3 $\mu$m and less, and more preferably in a range of 0.1 µm and less. The above ranges allow for an increase effect of suppressing abrasion of the inner wall surfaces of the mixing portion of the cleaning nozzle. As a result, particle generation from the cleaning nozzle may be suppressed still further.

The construction of the cleaning nozzle is not limited to that shown in FIG. 1, for example, where a gas introduction pipe for introducing the gas surrounds a supply pipe for supplying the cleaning liquid. It is preferred that the supply pipe surrounds the gas introduction pipe. Where the supply pipe surrounds the gas introduction pipe, the mixing portion has reduced areas for direct contact between the gas and the inner wall surfaces of the cleaning nozzle. The reduced contact areas further suppress abrasion of the inner wall surfaces of the cleaning nozzle, thereby further suppressing particle generation from the cleaning nozzle.

The cleaning nozzle is not limited to a particular shape. It is preferred, however, that the gas introduction pipe is shaped cylindrical or the cleaning nozzle has a main body thereof shaped cylindrical, or the gas introduction pipe extends linearly to the mixing portion. This provides reduced areas for the gas and mist to collide with the inner walls of the gas introduction pipe and cleaning nozzle to suppress particle generation.

The material for presenting smooth surfaces, such as quartz, preferably has the surfaces smoothed by surface treatment.

A substrate cleaning apparatus according to the present invention for cleaning a substrate by supplying a cleaning liquid turned into mist to the substrate, comprises a cleaning nozzle having a mixing portion for mixing the cleaning liquid and a pressurized gas to form mist, and discharging the mist formed in the mixing portion, wherein the cleaning nozzle has at least inner walls of the mixing portion presenting smooth surfaces.

In the substrate cleaning apparatus according to the present invention, the cleaning nozzle according to the invention suppresses particle generation therefrom, thereby preventing particles from being newly generated in time of cleaning. As a result, particles adhering to the substrate surface after the cleaning may also be reduced.

In the substrate cleaning apparatus according to the invention, as in the cleaning nozzle according to the invention, a preferred example of the material for forming the inner wall surfaces of the mixing portion is quartz.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 4 is a view in vertical section showing a modified cleaning nozzle; and

FIG. 5 is a view in vertical section showing another modified cleaning nozzle.

DESCRIPTION OF THE PREFERRED EMBODIMENTS

Preferred embodiments of the present invention will be described in detail hereinafter with reference to the drawings.

Figure 2:
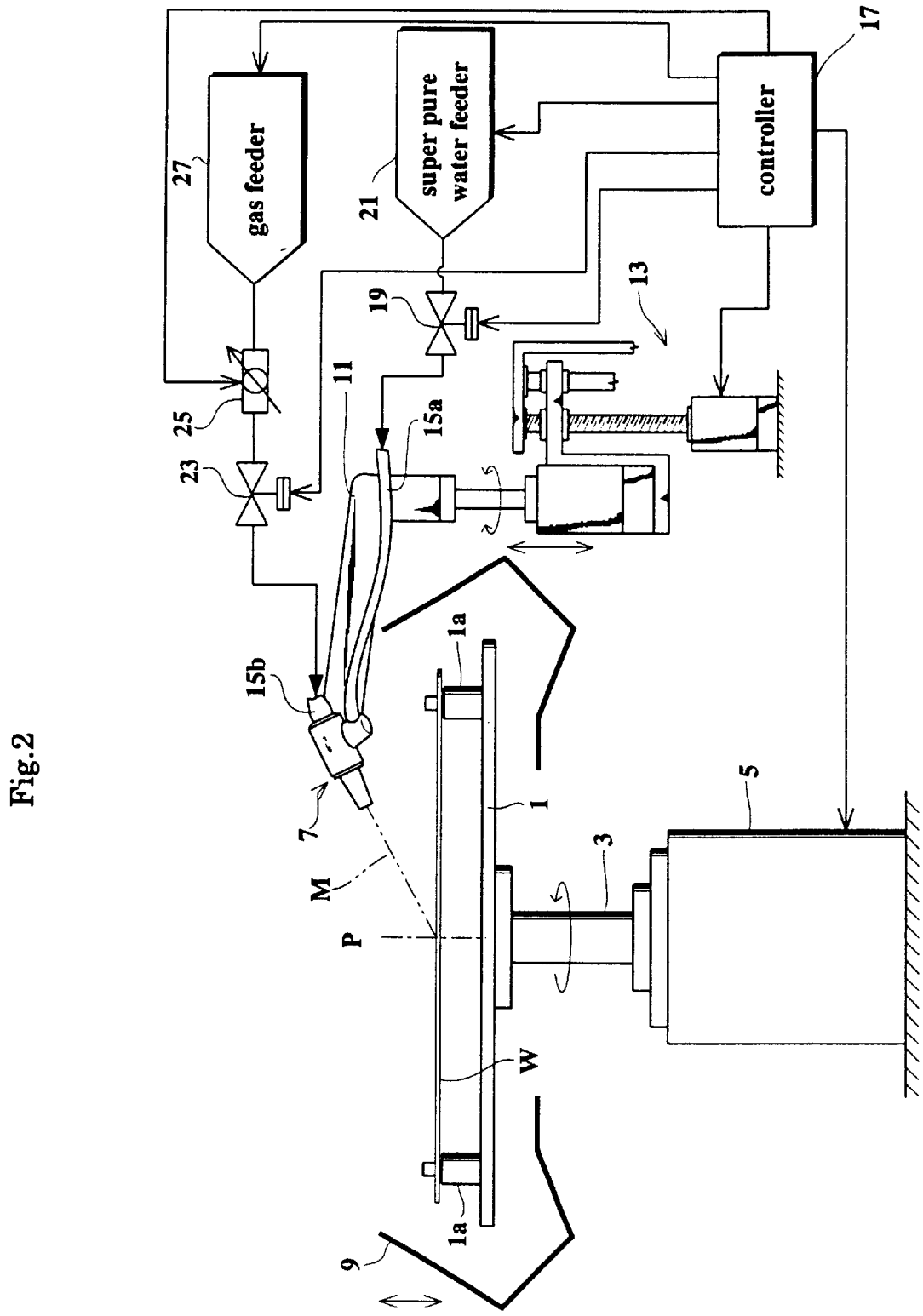
FIG. 2 is a block diagram showing an outline of a substrate cleaning apparatus according to the present invention.
Figure 3:
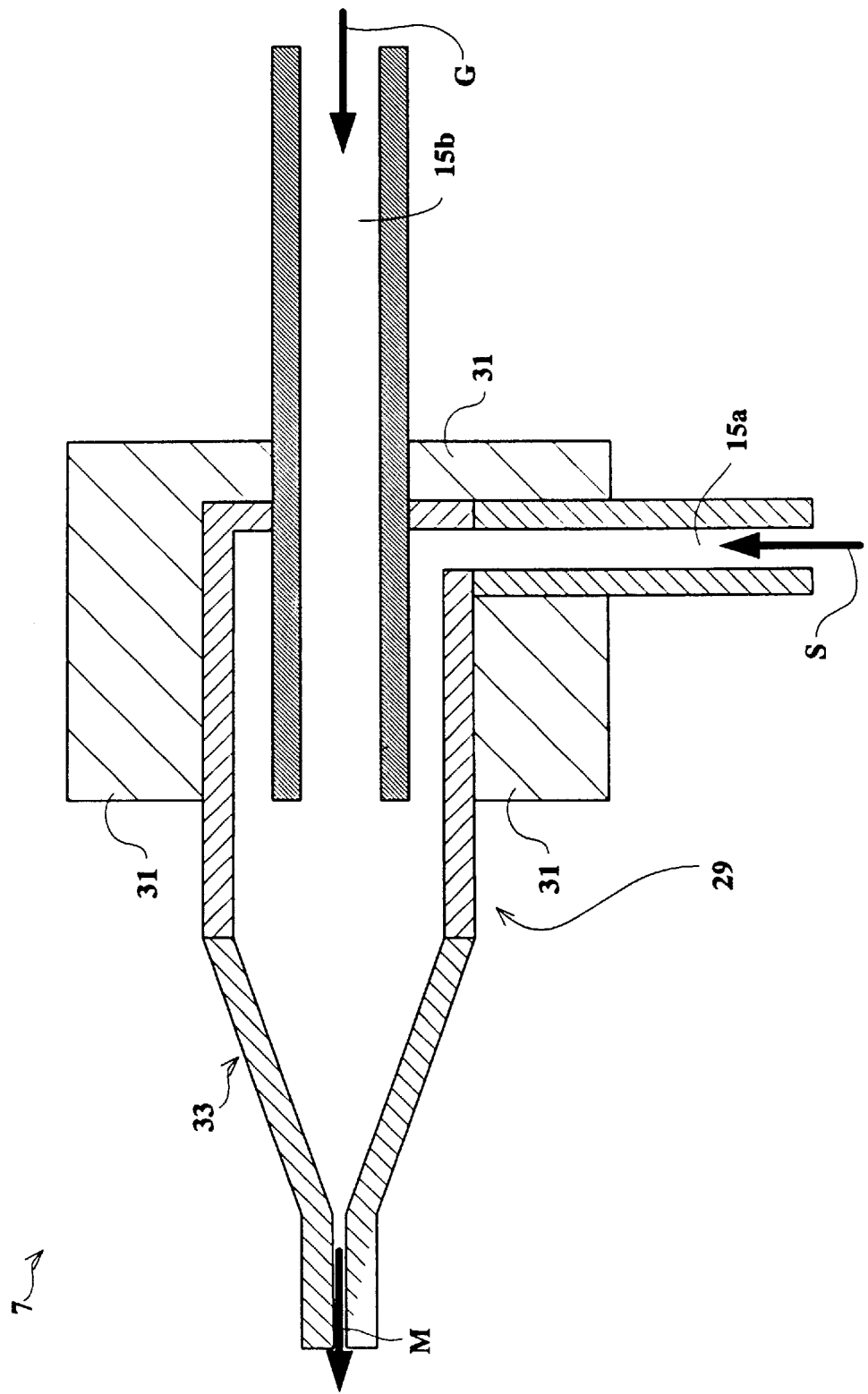
FIG. 3 is a view in vertical section showing a cleaning nozzle according to the present invention.

FIG. 2 is a block diagram showing an outline of a substrate cleaning apparatus according to the present invention. FIG. 3 is a view in vertical section showing a cleaning nozzle according to the invention.

As shown in FIG. 2, a disk-shaped spin chuck 1 having six cylindrical support pins 1a erected thereon is spun by an electric motor 5 through a rotary shaft 3 connected to the bottom of spin chuck 1. FIG. 2 shows only two support pins 1a to avoid complexity of illustration. With a spin of spin chuck 1, a wafer W supported at edges thereof by the support pins 1a spins in a horizontal plane about a spin center P.

The spin chuck 1 is surrounded by a scatter preventive cup 9 for preventing scattering of mist M discharged from a binary fluid cleaning nozzle 7 which forms the mist M by mixing a pressurized gas G and a cleaning liquid S.

The scatter preventive cup 9 is moved vertically relative to the spin chuck 1 as indicated by an arrow in FIG. 2, when a wafer W to be cleaned is placed on the spin chuck 1 and when a transport device not shown receives a cleaned wafer W from the spin chuck 1.

As shown in FIG. 2, the cleaning nozzle 7 is supported in an inclined posture by a support arm 11, with a discharge opening pointed to the spin center P. The nozzle 7 is vertically movable and swingable, along with the support arm 11, by a drive mechanism 13 as indicated by arrows in FIG. 2. The nozzle 7 is swingable between a cleaning position above the wafer W and a standby position retracted sideways from the wafer W and scatter preventive cup 9. The nozzle 7 has, connected to a barrel portion thereof, a supply pipe 15a for supplying the cleaning liquid S, and a gas introduction pipe 15b for introducing the pressurized gas G. The supply pipe 15a receives super pure water as the cleaning liquid S from a super pure water feeder 21 through a control valve 19 operable by a controller 17. The gas introduction pipe 15b receives the gas G from a gas feeder 27 through a control valve 23 operable by the controller 17 and a pressure regulator 25 also operable by the controller 17 to effect a pressure regulation such as compression or decompression of the gas G.

In this embodiment, super pure water is used as the cleaning liquid S. This is not limitative, but any cleaning solution used in usual substrate cleaning may be used, which is exemplified by acid, alkali, and ozone water with ozone dissolved in deionized water. The gas G is not limited to any particular type, but a gas, such as air, used with a usual binary fluid nozzle may be used here.

The electric motor 5, drive mechanism 13, control valves 19 and 23, super pure water feeder 21, pressure regulator 25 and gas feeder 27 noted above are controlled en bloc by the controller 17.

Next, the cleaning nozzle 7 having the characteristic features of the present invention will be described in detail with reference to FIG. 3. The cleaning nozzle 7 includes a mixing portion 29 having a double pipe construction with the supply pipe 15a supported by a support 31 to surround the gas introduction pipe 15b, i.e. the gas introduction pipe 15b being inserted in the supply pipe 15a. The cleaning nozzle 7 includes a tip 33 having an orifice pipe formed integral with an accelerator pipe in the form of a straight cylindrical pipe for accelerating the mist M. The tip 33 is disposed downstream of the mixing portion 29 in the direction of delivery of the mist M. The mixing portion 29 is formed of quartz with surface irregularities not exceeding 0.3 µm, preferably 0.1 µm or less. Particles could be generated when the gas G and mist M collide with inner walls of the gas introduction pipe 15b and cleaning nozzle 7. To reduce the possibility of collision, the gas introduction pipe 15b and the main body of cleaning nozzle 7, preferably, are shaped cylindrical, with the gas introduction pipe 15b extending straight into the mixing portion 29.

Portions of the supply pipe 15a and gas introduction pipe 15b outside the mixing portion 29, as well as the support 31 and tip 33, are formed of fluororesin. The quartz noted above is formed by melting quartz once, and then given surface treatment such as by etching with a hydrofluoric acid solution or the like to smooth its surfaces. This treatment results in surface irregularities smoothed to a range of 0.1 μm and less.

Next, operation of the cleaning nozzle and the substrate cleaning apparatus constructed as described above will be described. First, the scatter preventive cup 9 is lowered relative to the spin chuck 1, and a wafer W is placed on the spin chuck 1. The scatter preventive cup 9 is raised, and the cleaning nozzle 7 is moved to the cleaning position. Next, the mist M is supplied from the cleaning nozzle 7 to the wafer W spinning at a fixed low speed, so that the mist M strikes the wafer W. After the cleaning process noted above is maintained for a fixed time, the delivery of mist M is stopped and the cleaning nozzle 7 is moved to the standby position. At the same time, a spin drying process is carried out in which the wafer W is spun at high speed to scatter the cleaning liquid S to the ambient. This completes the series of cleaning steps.

Next, a procedure and functions for discharging the mist M from the cleaning nozzle 7 to supply the cleaning liquid S in the mist M to the wafer W will be described. First, the controller 17 operates the pressure regulator 25 to regulate the pressure of gas G supplied from the gas feeder 27. Normally, the gas G is pressurized to increase the delivery speed near the speed of sound in the accelerator pipe at the tip 33 as noted hereinbefore. After regulating the pressure of gas G, the controller 17 opens the control valve 19 on the supply pipe 15a and the control valve 23 on the gas introduction pipe 15b. As the control valves 19 and 23 are opened, as shown in FIG. 3, the cleaning liquid S is supplied from the super pure water feeder 21 via the supply pipe 15a to the mixing portion 29 of the cleaning nozzle 7, while the gas G is supplied from the gas feeder 27 via the gas introduction pipe 15b to the mixing portion 29 of the cleaning nozzle 7.

In the mixing portion 29, the gas G from the gas introduction pipe 15b mixes with the cleaning liquid S supplied from outside of the gas introduction pipe 15b, to become the mist M which moves toward the tip 33 and is delivered from the tip 33 toward the wafer W. The accelerator pipe at the tip 33 of cleaning nozzle 7 increases the delivery speed of the mist M near the speed of sound. By the above delivery of the mist M, the cleaning liquid S is supplied as part of the mist M.

The delivery of the mist M is stopped by the controller 17 transmitting control signals for operating the pressure regulator 25 to decompress the gas G to zero pressure, and close the control valve 19 and control valve 23, thereby stopping the supply of gas G and cleaning liquid S.

The above cleaning functions produce the following effects. The mixing portion 29 is given smooth inner wall surfaces only by forming the mixing portion 29 of quartz with surface irregularities not exceeding 0.3 μm, preferably 0.1 μm or less. This suppresses abrasion of the inner walls of the mixing portion 29. A large part of dust particles from the cleaning nozzle 7 results from abrasion of the inner wall surfaces of the mixing portion 29 of the cleaning nozzle 7. Thus, dust particles from the cleaning nozzle 7 are suppressed.

Further, since the cleaning nozzle 7 has the construction shown in FIG. 3, the cleaning liquid S is supplied outwardly of the gas G to reduce the possibility of contact in the mixing portion 29 between the gas G and the inner wall surfaces of the cleaning nozzle 7. As a result, the gas G or mist M has less chance of colliding with the inner walls of the mixing portion 29 to further suppress particle generation from the cleaning nozzle 7.

With the suppression of particle generation from the cleaning nozzle 7, a reduced amount of particles is newly generated in time of cleaning. Thus, the cleaning liquid S is driven against the wafer W while particle generation is suppressed in time of cleaning, thereby to reduce particles adhering to the surface of wafer W after the cleaning.

The present invention is not limited to the above embodiment, but may be modified as follows:

(1) In the above embodiment, the mixing portion 29 in the cleaning nozzle 7 is formed of quartz. However, the invention is not limited to a particular material, but may be ceramics or sapphire, for example, as long as the inner walls of the mixing portion 29 are formed to have smooth surfaces. In order to suppress the generation of particles from the cleaning nozzle 7, it is preferable to form the inner wall surfaces of the cleaning nozzle 7 by using a hard material such as quartz that is resistive to abrasion.

(2) In the foregoing embodiment, only the mixing portion 29 of the cleaning nozzle 7 is formed with smooth surfaces, the other portions being formed of fluororesin. The main body of cleaning nozzle 7 may be formed as an integral unit having smooth surfaces. This construction will suppress abrasion due to a collision with the gas G or mist M of the inner walls not only of the mixing portion 29 but of the entire cleaning nozzle 7. This abrasion suppressing action is effective with the inner wall surfaces of the tip region, particularly vulnerable to abrasion, where the mist is accelerated most to high speed. Thus, compared even with the above embodiment, this construction can suppress particle generation from the cleaning nozzle 7 with increased effect.

A construction as shown in FIG. 4 may be employed. That is, the cleaning nozzle 7 may have the mixing portion 29, tip 33 and accelerator pipe all formed of quartz to be integral with one another. Here, the gas introduction pipe 15b also is formed of quartz. The gas introduction pipe 15b is inserted into the mixing portion 29 through the support 31. The mixing portion 29 has a projection 35 formed peripherally thereof and engaged with the support 31 to retain the nozzle 7 in place.

This construction also will suppress abrasion due to a collision with the gas G or mist M of the inner walls not only of the mixing portion 29 but of the tip 33, particularly vulnerable to abrasion, where the mist is accelerated most to high speed.

Thus, compared even with the above embodiment, this construction can suppress particle generation from the cleaning nozzle 7 with increased effect.

The cleaning nozzle 7 having the mixing portion 29, tip 33 and accelerator pipe formed of quartz to be integral with one another fulfills the object of suppressing particle generation from the cleaning nozzle 7 with increased effect, without using quartz for forming additional parts.

(3) In the foregoing embodiment, the entire mixing portion 29 of the cleaning nozzle 7 is formed to have smooth surfaces. As in a modification shown in FIG. 5, the mixing portion 29 may have only inner walls 29a thereof presenting smooth surfaces, with outer walls formed of a different material to the inner walls. The outer walls never contact the gas G or mist M, and do not necessarily require smooth surfaces. The outer walls may therefore be formed of metal, fluororesin or the like having rough surfaces. Of course, the entire inner walls of the cleaning nozzle 7 may be formed to present smooth surfaces.

Figure 1:
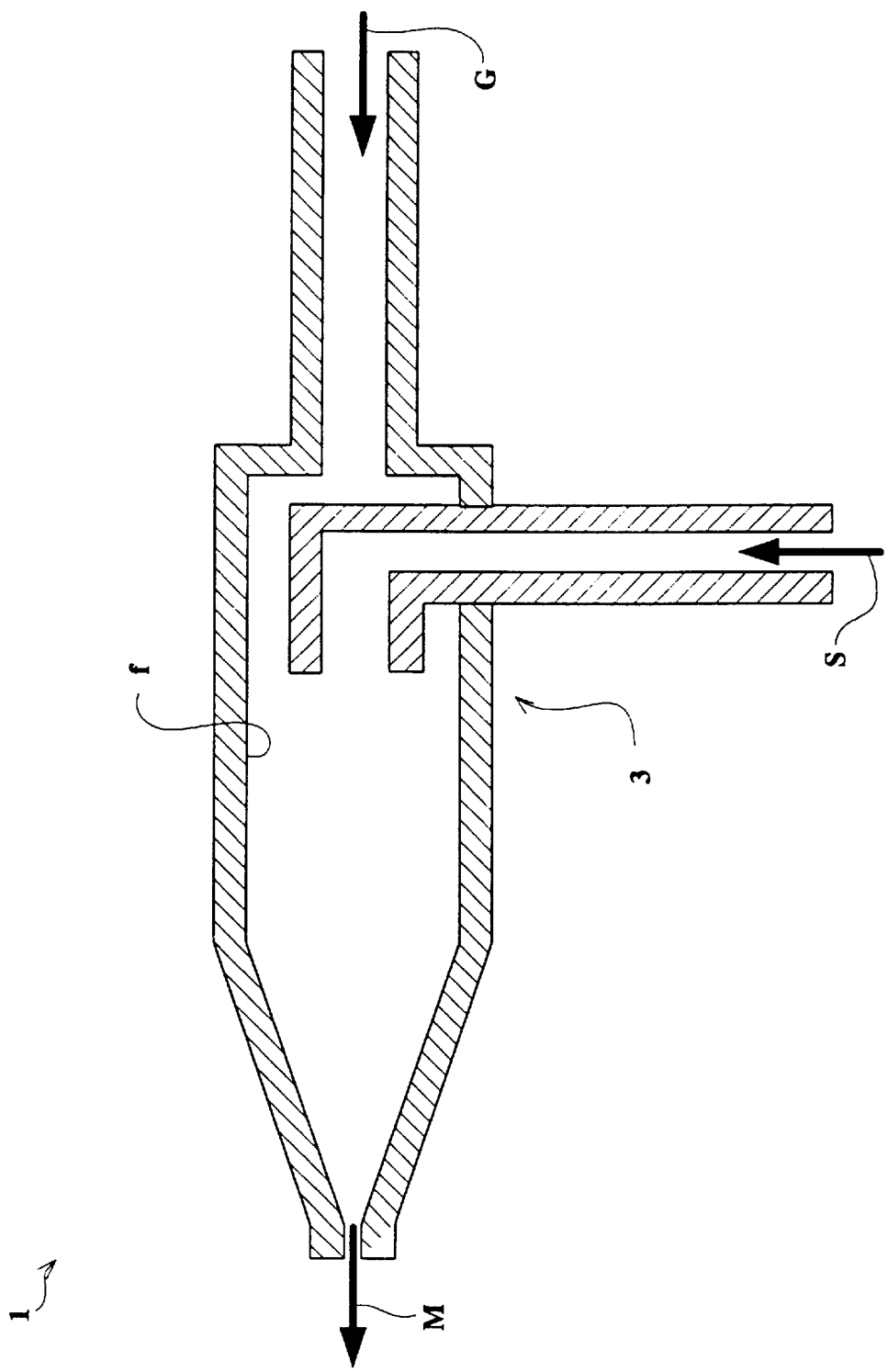
FIG. 1 is a view in vertical section showing a conventional cleaning nozzle used in experiment that has led to the present invention.

(4) The cleaning nozzle 7 in the foregoing embodiment is shaped as shown in FIG. 3. Since particle generation is suppressed only by forming the mixing portion 29 with quartz, the cleaning nozzle 7 is not limited to a particular shape or construction, but may be constructed to have a shape as shown in FIG. 1, for example.

(5) The substrate cleaning apparatus in the foregoing embodiment is intended for performing cleaning treatment by supplying a cleaning liquid. The invention is applicable also to a substrate cleaning apparatus intended for performing film removing treatment by supplying a treating solution to substrates to remove film coatings therefrom.

The present invention may be embodied in other specific forms without departing from the spirit or essential attributes thereof and, accordingly, reference should be made to the appended claims, rather than to the foregoing specification, as indicating the scope of the invention.

What is claimed is:

1. A cleaning nozzle having a mixing portion for mixing a cleaning liquid and a pressurized gas to form mist, and discharging said mist formed in said mixing portion;
   wherein said cleaning nozzle has at least inner walls of said mixing portion presenting smooth surfaces; said smooth surfaces being provided by an etching treatment.

2. A cleaning nozzle as defined in claim 1, wherein at least said inner walls of said mixing portion have smooth surfaces with surface irregularities in a range of 0.3 $\mu$m and less.

3. A cleaning nozzle as defined in claim 1, wherein at least said inner walls of said mixing portion have smooth surfaces with surface irregularities in a range of 0.1 $\mu$m and less.

4. A cleaning nozzle as defined in claim 1, comprising:
   a tip portion disposed downstream of said mixing portion in a direction of discharge of said mist;
   at least inner walls of said mixing portion and said tip portion having smooth surfaces.

5. A cleaning nozzle as defined in claim 1, wherein said cleaning nozzle has a main body that is cylindrical in shape.

6. A cleaning nozzle as defined in claim 1, wherein said mixing portion includes a gas introduction pipe for introducing the gas, and a supply pipe for supplying the cleaning liquid, said gas introduction pipe being cylindrically shaped.

7. A cleaning nozzle as defined in claim 1, wherein said mixing portion includes a gas introduction pipe for introducing the gas, and a supply pipe for supplying the cleaning liquid, said gas introduction pipe extending linearly to said mixing portion.

8. A substrate cleaning apparatus for cleaning a substrate by supplying a cleaning liquid turned into mist to the substrate, said apparatus comprising:
   a cleaning nozzle having a mixing portion for mixing the cleaning liquid and a pressurized gas to form mist, and discharging said mist formed in said mixing portion;
   wherein said cleaning nozzle has at least inner walls of said mixing portion presenting smooth surfaces; said smooth surfaces being provided by an etching treatment.

9. A cleaning nozzle having a mixing portion for mixing a cleaning liquid and a pressurized gas to form mist, and discharging said mist formed in said mixing portion;
   wherein said cleaning nozzle has at least inner walls of said mixing portion formed of quartz; and
   wherein said mixing portion is constructed with a supply pipe for supplying the cleaning liquid surrounding a gas introduction pipe for introducing the gas.

10. A cleaning nozzle as defined in claim 9, comprising:
    a tip portion disposed downstream of said mixing portion in a direction of discharge of said mist;
    an accelerator pipe;
    wherein at least said mixing portion and said tip portion and said accelerator pipe are formed of quartz to be integral with one another.

11. A cleaning nozzle as defined in claim 9, wherein at least said inner walls of said mixing portion have smooth surfaces with surface irregularities in a range of 0.3 $\mu$m and less.

12. A cleaning nozzle as defined in claim 9, wherein at least said inner walls of said mixing portion have smooth surfaces with surface irregularities in a range of 0.1 $\mu$m and less.

13. A cleaning nozzle as defined in claim 9, wherein said quartz has surfaces thereof smoothed by surface treatment.

14. A cleaning nozzle as defined in claim 9, wherein said cleaning nozzle has a main body that is cylindrical in shape.

15. A cleaning nozzle as defined in claim 9, wherein said mixing portion includes a gas introduction pipe for introducing the gas, and a supply pipe for supplying the cleaning liquid, said gas introduction pipe being cylindrically shaped.

16. A cleaning nozzle as defined in claim 9, wherein said mixing portion includes a gas introduction pipe for introducing the gas, and a supply pipe for supplying the cleaning liquid, said gas introduction pipe extending linearly to said mixing portion.

17. A substrate cleaning apparatus for cleaning a substrate by supplying a cleaning liquid turned into mist to the substrate, said apparatus comprising:
    a cleaning nozzle having a mixing portion for mixing the cleaning liquid and a pressurized gas to form mist, and discharging said mist formed in said mixing portion; and
    a tip portion disposed downstream of said mixing portion in a direction of discharge of said mist;
    wherein said mixing portion and said tip portion have at least inner walls formed of quartz to be integral with each other.

18. A substrate cleaning apparatus for cleaning a substrate by supplying a cleaning liquid turned into mist to the substrate, said apparatus comprising:
    a cleaning nozzle having a mixing portion for mixing the cleaning liquid and a pressurized gas to form mist, and discharging said mist formed in said mixing portion;
    wherein said cleaning nozzle has at least inner walls of said mixing portion formed of quartz; and
    wherein said mixing portion is constructed with a supply pipe for supplying the cleaning liquid surrounding a gas introduction pipe for introducing the gas.

19. A cleaning nozzle having a mixing portion for mixing a cleaning liquid and a pressurized gas to form mist, and discharging said mist formed in said mixing portion;
    wherein said cleaning nozzle has at least inner walls of said mixing portion presenting smooth surfaces; and wherein said mixing portion is constructed with a supply pipe for supplying the cleaning liquid surrounding a gas introduction pipe for introducing the gas.

20. A cleaning nozzle as defined in claim 19, comprising:

a tip portion disposed downstream of said mixing portion in a direction of discharge of said mist;

at least inner walls of said mixing portion and said tip portion having smooth surfaces.

21. A substrate cleaning apparatus for cleaning a substrate by supplying a cleaning liquid turned into mist to the substrate, said apparatus comprising:

a cleaning nozzle having a mixing portion for mixing the cleaning liquid and a pressurized gas to form mist, and discharging said mist formed in said mixing portion;

wherein said cleaning nozzle has at least inner walls of said mixing portion presenting smooth surfaces; and wherein said mixing portion is constructed with a supply pipe for supplying the cleaning liquid surrounding a gas introduction pipe for introducing the gas.

22. A cleaning nozzle having a mixing portion for mixing a cleaning liquid and a pressurized gas to form mist, and discharging said mist formed in said mixing portion, said cleaning nozzle comprising:

a tip portion disposed downstream of said mixing portion in a direction of discharge of said mist;

wherein said mixing portion and said tip portion have at least inner walls formed of quartz to be integral with each other.

23. A cleaning nozzle as defined in claim 22, wherein said quartz has surfaces thereof smoothed by surface treatment.

* * * * *